US008676547B2

(12) United States Patent
Seki (10) Patent No.: US 8,676,547 B2
(45) Date of Patent: Mar. 18, 2014

(54) PARAMETER EXTRACTION METHOD (75) Inventor: Mitsuro Seki, Hamamatsu (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 985 days.

(21) Appl. No.: 11/785,415

(22) Filed: Apr. 17, 2007

(65) Prior Publication Data

US 2007/0260433 A1 Nov. 8, 2007

(30) Foreign Application Priority Data

Apr. 18, 2006 (JP) ................. 2006-114945

(51) Int. Cl.
G06F 17/10 (2006.01)
(52) U.S. Cl.
USPC .......................................................... 703/2
(58) Field of Classification Search
USPC .......................................................... 703/2
See application file for complete search history.

(56) References Cited

U.S. PATENT DOCUMENTS

| 7,533,356 B2 | 5/2009 | Murakawa et al. | |
| 2002/0095273 A1* | 7/2002 | Tanizawa | 702/189 |
| 2006/0010091 A1* | 1/2006 | Wada | 706/46 |

FOREIGN PATENT DOCUMENTS

| EP | 1737041 A | 12/2006 |
| JP | 08-110902 | 4/1996 |
| JP | 2001-148333 | 5/2001 |
| JP | 2001-350741 A | 12/2001 |
| WO | WO-2005/096386 | 10/2005 |

OTHER PUBLICATIONS

Steven G. Skaggs et al., "Parameter Extraction of Microwave Transistors using a Hybrid Gradient Descent and Tree Annealing Approach", 1993, IEEE Transactions on Microwave Theory and Techniques, vol. 41, No. 4, pp. 726-729.*
Griff L. Bilbo et al., "Extraction of the parameters of equivalent circuits of microwave transistors using tree annealing", 1990, IEEE Transactions on microwave theory and techniques, vol. 38, No. 11, pp. 1711-1718.*
William H. Press et al., "Numerical recipes in Fortran 77 The art of scientific computing", second edition, 1997, Cambridge University Press, pp. 355-360.*
Peter Ross et al., "Comparing genetic algorithms, simulated annealing, and stochastic hillclimbing on timetabling problems" from the book "Evolutionary Computing", 1995, Springer Berlin, pp. 94-102.*
Sudhir M. Gowda et al., "Effective parameter extraction using multiple-objective function for VLSI circuits", 1994, Analog Integrated Circuits and Signal Processing, vol. 5, pp. 121-133.*

(Continued)

*Primary Examiner* — Kamini S Shah
*Assistant Examiner* — Russ Guill
(74) *Attorney, Agent, or Firm* — Eric J. Robinson; Robinson Intellectual Property Law Office, P.C.

(57) ABSTRACT

It is an object to provide a parameter extraction method using a model equation having a physical meaning, in which parameters optimum for an element are extracted without setting appropriate initial values based on experience or deep understanding of models and actual device characteristics.
A structure is provided in which multiple patterns of initial values of parameters are generated by a random number generator mechanism, and automatic parameter extraction is executed for each initial value to select a combination of parameters in which ultimate difference between a calculated value and a measured value is minimized thereby finding an optimal solution.

6 Claims, 5 Drawing Sheets

(56) References Cited

OTHER PUBLICATIONS

Yu Hen Hu et al., "SaPOSM: An Optimization Method Applied to Parameter Extraction of MOSFET Models," 1993, IEEE Transactions on Computer-Aided Design of Integrated Circuits and Systems, vol. 12, No. 10, pp. 1481-1487.*

Man-Kuan Via et al., "Modeling of microwave semiconductor devices using simulated annealing," 1989, IEEE Transactions on Electron Devices, vol. 36, No. 4, pp. 761-762.*

Rafael Marti, "Multi-start Methods," 2002, in "Handbook of Metaheuristics," edited by Fred Glover et al., Kluwer Academic Publishers, 31 pages.*

P.A. Linden et al., "Concurrent global optimization for microwave-device parameter estimation," 1993, IEE Proceedings-H, vol. 140, No. 2, pp. 71-78.*

* cited by examiner

PARAMETER EXTRACTION METHOD

BACKGROUND OF THE INVENTION

1. Field of the Invention

The present invention relates to a parameter extraction method for elements having a plurality of parameters, and to a computer readable storage medium containing a program executing the parameter extraction method. In particular, the present invention relates to a parameter extraction method for semiconductor circuit simulation in designing semiconductor circuits, in which behaviors of designed circuits are verified by assigning parameters describing behaviors of circuit components using model equations for semiconductor elements, and further relates to a computer readable storage medium containing a program executing the parameter extraction method.

2. Description of the Related Art

In general, circuit simulation is performed to verify operations of a circuit by directly inputting conditions required for circuit simulation, such as circuit connections, element model parameters, analysis conditions, output conditions; or by indirectly using the data of input information.

The element model parameters of the input information are physical parameters or semiempirically determined parameters, which are included in an analytic expression in which an input-output response characteristics of an element is modeled. As an example of MOSFET (Metal-Oxide-Semiconductor Field-Effect Transistor) models, a BSIM3 model or the like can be used. BSIM3 is a model generally called a SPICE (Simulation Program with Integrated Circuit Emphasis) model, which reproduces an input-output responses of elements on a SPICE-based circuit simulator commonly used for circuit simulation. BSIM3 is made to require less calculation because it is used for calculations handling behaviors of as many as several ten thousands or more elements at a time.

Instead of using element model parameters, a method of reproducing behaviors of an element by a device simulation device may be used to perform circuit simulation. However, when a device simulation device is used in combination with a circuit simulation device, the scale of analysis becomes larger at the cost of higher analytical accuracy; besides, speed of analysis is reduced accordingly. Therefore, it is not practical to use a device simulation device, which is rarely used.

As a result, when simulation of a large-scale circuit is performed, generally, behaviors of elements forming a circuit are described using model equations and model parameters of the elements to perform circuit simulation by processing the information on model equations and the element model parameters using a circuit simulation device. In this case, if device characteristics reproduced from the model equations and the element model parameters do not fully match the characteristics of the elements forming the circuit, the simulation result of the circuit does not agree with an analysis result of a circuit actually formed.

In order to verify circuit operation with high accuracy, at the element level, it is necessary to determine element model parameters appropriately. As criteria of whether the element model parameters are appropriate or not, the difference between measured characteristics of an element (hereinafter referred to as measured characteristics) and calculated values based on an analytical model (hereinafter referred to as virtual characteristics)(hereinafter also referred to simply as error) is used. Element model parameters are combined so as to ideally minimize this error, and the difference is used to verify circuit operation; thus, highly accurate verification can be performed. Determining a combination of model parameters used for verifying circuit operation is referred to as parameter extraction.

Further, with respect to a method for efficiently extracting parameters regarding behaviors of elements forming a circuit, for example, Reference 1 (Japanese Published Patent Application No. 2001-148333) discloses a technique in which a solution such as Newton's method or a variant thereof is implemented to minimize the difference between a measured value and a calculated value to find approximations to the true value.

SUMMARY OF THE INVENTION

In order to extract specific element model parameters (hereinafter also referred to simply as parameters) from measured characteristics, there are two methods. One of them is a method in which an operator input arbitrary parameters to approximate virtual properties to measured values. The other is a method in which virtual properties are approximated to measured characteristics automatically with a computer using some algorithm as described in Reference 1.

In the case where virtual properties are approximated to measured characteristics automatically by a computer using some algorithm, for example, a nonlinear least square method, it is required to set the initial value, the maximum value, and the minimum value of each parameter. The computer modifies the parameters so as to reduce the difference between the virtual properties and the measured characteristics until the difference is minimized or each parameter reaches the maximum value or the minimum value.

The initial value can be arbitrarily set by a parameter extraction operator, and this operation of setting the initial value is very important. That is because there is normally a plurality of solutions for each of the parameters which minimize the difference between the virtual properties and the measured properties, and a solution obtained among the solutions depends on the initial value. Further, some of the solutions will cause a state where calculated values are completely different from and not close to the measured value. This situation will be described with reference to FIG. 4.

Figure 4:
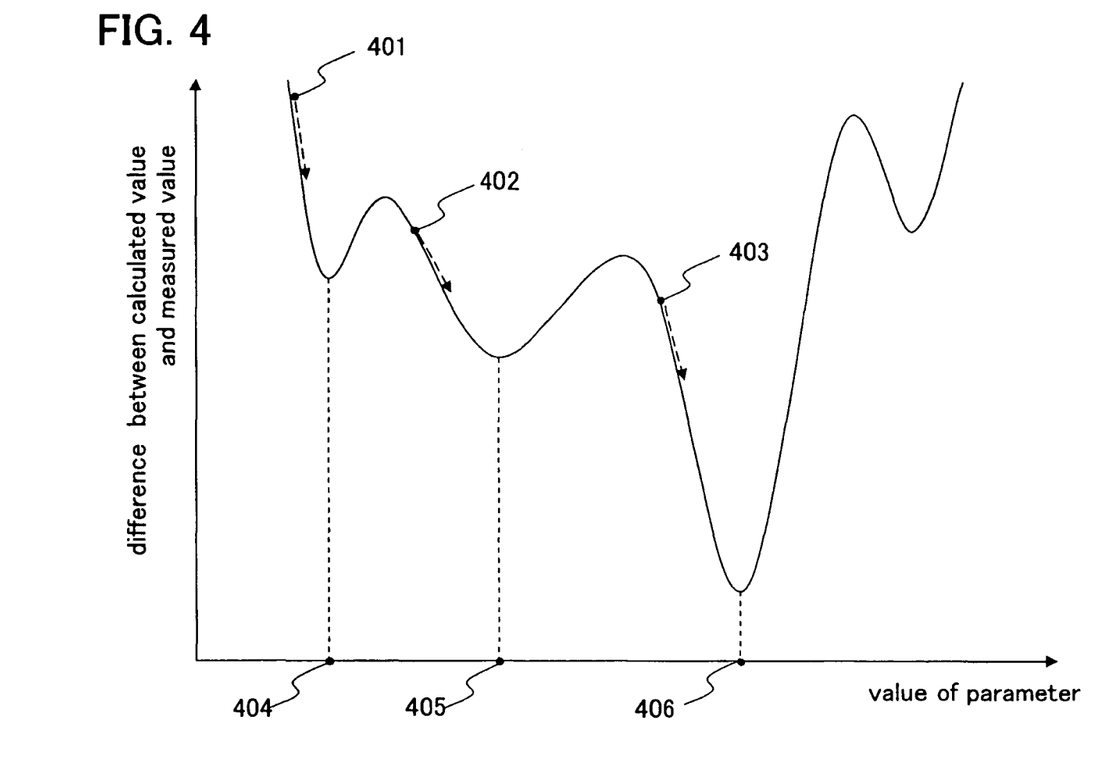
FIG. 4 is a diagram illustrating a parameter extraction method of the present invention.

FIG. 4 is a graph showing the relationship between the parameter and the difference. The parameter on the horizontal axis of the graph corresponds to element model parameters, for example, parameters such as VTH, ETA, and GAMMA in the case of a model of UCB (University of California at Berkeley) MOSFET LEVEL3.

On the other hand, the difference on the vertical axis of the graph in FIG. 4 corresponds to errors between the virtual properties and the measured properties. The virtual properties mean device properties obtained by assigning specific values to each element model parameter.

With regard to FIG. 4, it can be said that better parameters are extracted by finding parameters which minimize errors, and acquiring the parameters.

However, the relationship between the parameter and the difference normally involves multiple extrema as shown in FIG. 4. In parameter extraction, it is necessary to find the optimal solution of each parameter so as to reduce the difference by controlling the parameters one by one as necessary.

Thus, when an operator modifies parameters, the parameters can be modified to his/her satisfaction. However, in order to extract the optimal solution of a parameter, which minimize the difference, it is necessary to understand a model used in detail and to understand properties of an object element of which parameters are extracted. Since the properties of an element depends on a manufacturing process, it is required to understand the properties of an element separately with respect to each process.

When an operator extract parameters automatically using a computer and software, parameters are modified using a non-linear least square algorithm such as Levenberg-Marquardt method. However, in such a method when an extremum exists between the initial value and the optimal solution, the computer extracts the extremum as a parameter. For example, with reference to FIG. 4, when an initial value 401 is set for a computer to extract a parameter, the computer modifies a parameter so that the difference is reduced to extract a stable solution 404, which makes the difference assume a minimal value, as the parameter. When an initial value 402 is set for the computer to similarly extract a parameter, a stable solution 405 is extracted as the parameter. A stable solution 406, which is the optimal solution, can be automatically extracted only after an initial value 403 is set for the computer.

Note that, in this specification, the optimal solution corresponds to a set of solutions which derive the minimum value of the difference of the whole physical property model used, which is obtained by modifying parameters so that the value of the difference reduces.

Note that here, for simplicity, a simple curve is used to show the relationship between the parameter and the difference. In reality, trends of each parameter vary, and besides, the trends change depending on other parameter values. In such a situation, it is not easy to set appropriate initial values.

As described above, setting of initial values is important, and the way of setting initial values is not limited to one way because it depends on a process, the size of an element, or the like. Moreover, there has been a problem in the case of extracting parameters of a plurality of elements made through the same processes for statistical analysis that if properties of the elements vary significantly, the optimal solution cannot be found using only one initial value.

Figure 2:
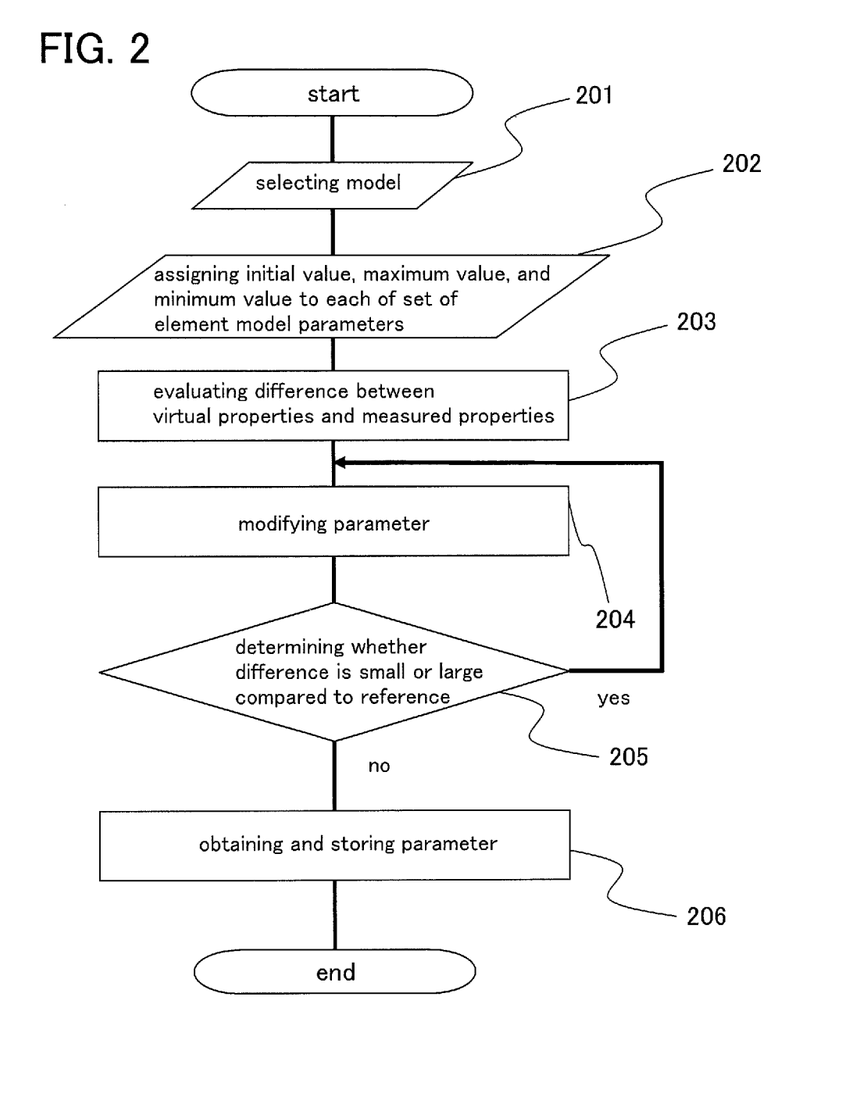
FIG. 2 is a flowchart of a conventional parameter extraction method.

FIG. 2 is a flowchart illustrating conventional parameter extraction. Here, a TFT (Thin Film Transistor) is described as an example of a physical device element. In order to approximate measured properties to virtual properties; first, a model to be used for creating virtual properties is selected in a step 201. This model means a model which can be used in a circuit simulator, for example, an RPI (Rensselaer Polytechnic Institute) p-Si model which is one of SPICE models for TFT.

Next, as shown in FIG. 2, an initial value, a maximum value, and a minimum value are inputted to each parameter of a model equation in a step 202. In the case of the above-described RPI p-Si model, for example, virtual properties can be described using a set of parameters of 50 or more at most including VTO relating to a threshold voltage. It is a parameter set for constituting the model equation, other than the parameter set, as an input value for defining an output value, a gate-source voltage and drain-source voltage are necessary.

Note that the maximum value and the minimum value are set to determine the range of changing parameters. If it is not determined, the parameters are modified endlessly, and there may be cases where the extremum of the difference between the virtual properties and the measured properties. In such a situation, calculation will never end; therefore, parameter modification is limited by determining the maximum value and the minimum value.

In FIG. 2, a step 203 is a step of evaluating the difference between the virtual properties and the measured properties, a step 204 and a step 205 are executed using the evaluated error as a reference.

In FIG. 2, the step 204 is a step of modifying a parameter to slightly increase or reduce the parameter from the initial value. The increase amount or the reduction amount are not limited in particular, and they are adjusted in accordance with the computing speed. Further, when a parameter is modified, the difference between the virtual properties and the measured properties is recomputed.

In FIG. 2, in response to the modification of the parameter and the evaluation of the difference between the virtual properties and the measured properties in step 204, the step 205 is a step of determining whether the difference is small or large compared to the reference. When the difference found in the step 204 is smaller than the reference, the difference found in the step 205 is specified as a new reference and the process returns to the step 204.

In FIG. 2, when the difference found in the step 204 is larger than the reference, the parameter set deriving the difference of the reference is obtained in a step 206, and the parameter set deriving the difference of the reference is stored.

Conventionally, as described with reference to FIG. 2, the following method has been adopted in which an operator inputs an initial value to each parameter on parameter extraction software, and modifies each parameter with the initial value as a starting point, so that a computer minimize the difference between a calculated value and a measured value based on an algorithm such as a nonlinear least square method.

However, when there is such a value that the difference between the calculated value and the measured value are minimized, between the initial value and the optimal solution of each parameter; parameter extraction is ended before the parameter reaches the optimal solution. In such a case, the difference between the calculated value and the measured value is often not reduced very much, and parameter extraction fails accordingly. Therefore, it is necessary to set the initial value as close as possible to the optimal solution. However, experience and deep understanding of models and actual device characteristics are required for setting an appropriate initial value. Further, it is necessary to review the initial value each time the process for forming an element is changed.

Moreover, when parameters of elements of the same kind on the same substrate are necessarily extracted for the purpose of statistical analysis, properties of each element may deviate by the level of several tens % due to variations resulted from the processes. In such a case, different initial values may be required to be set in order to find parameters optimum for the properties of each element.

In view of the above-described problems, the present invention provides a parameter extraction method using a model equation having a physical meaning, in which parameters optimum for an element are extracted without setting appropriate initial values based on experience or deep understanding of models and actual device characteristics and a computer readable storage medium containing a program executing the parameter extraction method.

In order to solve the above problems, a feature of the present invention is that multiple patterns of initial values of parameters are generated by a random number generator program, and automatic parameter extraction is executed for each initial value to select a combination of parameters in which ultimate difference between a calculated value and a measured value is minimized thereby finding an optimal solution.

One of parameter extraction methods of the present invention is a parameter extraction method for extracting parameters from a model equation, which includes the following steps of: setting an initial value of the parameter of the model equation; modifying the initial value of the parameter of the model equation; and evaluating a difference between an input-output response of a physical device and an output result of the model equation to which the parameter is inputted. The initial value of the parameter of the model equation is assigned by a random number generator program.

In accordance with the present invention, initial values of parameters are randomly generated by a random number generator program, and parameter extraction is extracted using the initial value as a starting point; thus, setting of initial value by an operator can be omitted.

Further, in order to set initial values appropriately, skills are required such as understanding of a model equation having a physical meaning and good understanding of processes and properties of an object physical device of which parameters is to be extracted. In accordance with the present invention, even novices can easily extract parameters of a model equation having a physical meaning. Thus, significant model modification, designing of a physical device, or change in a manufacturing process can be dealt flexibly.

Still further, in the case where parameter extraction of parameters of a model equation having a physical meaning is executed from an input-output responses of a plurality of physical devices having the same sizes which are manufactured through the same processes for the purpose of statistical analysis or the like, when there are significant variations between the input-output responses of the physical devices, there may be cases where optimal solutions of each device can not be obtained unless a plurality of initial values are prepared. The present invention particularly makes it possible in the case described above for even novices to find optimal solutions of parameters without inputting a plurality of initial values.

BRIEF DESCRIPTION OF DRAWINGS

In the accompanying drawings.

DETAILED DESCRIPTION OF THE INVENTION

Embodiment Modes and Embodiment

Embodiment modes and an embodiment according to the present invention will be described hereinafter with reference to the accompanying drawings. The present invention can be carried out in many different modes, and it is easily understood by those skilled in the art that modes and details herein disclosed can be modified in various ways without departing from the spirit and the scope of the present invention. It should be noted that the present invention should not be interpreted as construed to the description of the embodiment modes and embodiment given below. Note that, in the structures of the present invention described below, like reference numerals denote like elements in different drawings.
Embodiment Mode 1

Hereinafter, a parameter extraction method of the present invention will be described with reference to drawings.

Note that, in this embodiment mode, a semiconductor element is selected as a physical device for description which will be given using the semiconductor element for circuit simulation of a MOSFET in a semiconductor integrated circuit. Accordingly, device characteristics of a physical device are measured in advance. Note that a transistor or a resistance can be given as a physical device of a semiconductor element.

Note that a physical device here has physical properties of a semiconductor element or the like and outputs physical quantities in response to inputted physical quantities. The semiconductor element may be an active element typified by a transistor, for example, an element such as a MOSFET or a TFT, or a bipolar transistor, or a passive element such as a resistance element or a capacitor element.

Note that physical properties of an element here refers to correlation between an input signal value and an output signal value which are measured after fixing all conditions other than an inputted signal in a real element utilizing a variety of physical phenomenon. Accordingly, strictly speaking, a measured value refers to a value of each output signal describing physical properties which have been measured.

Figure 1:
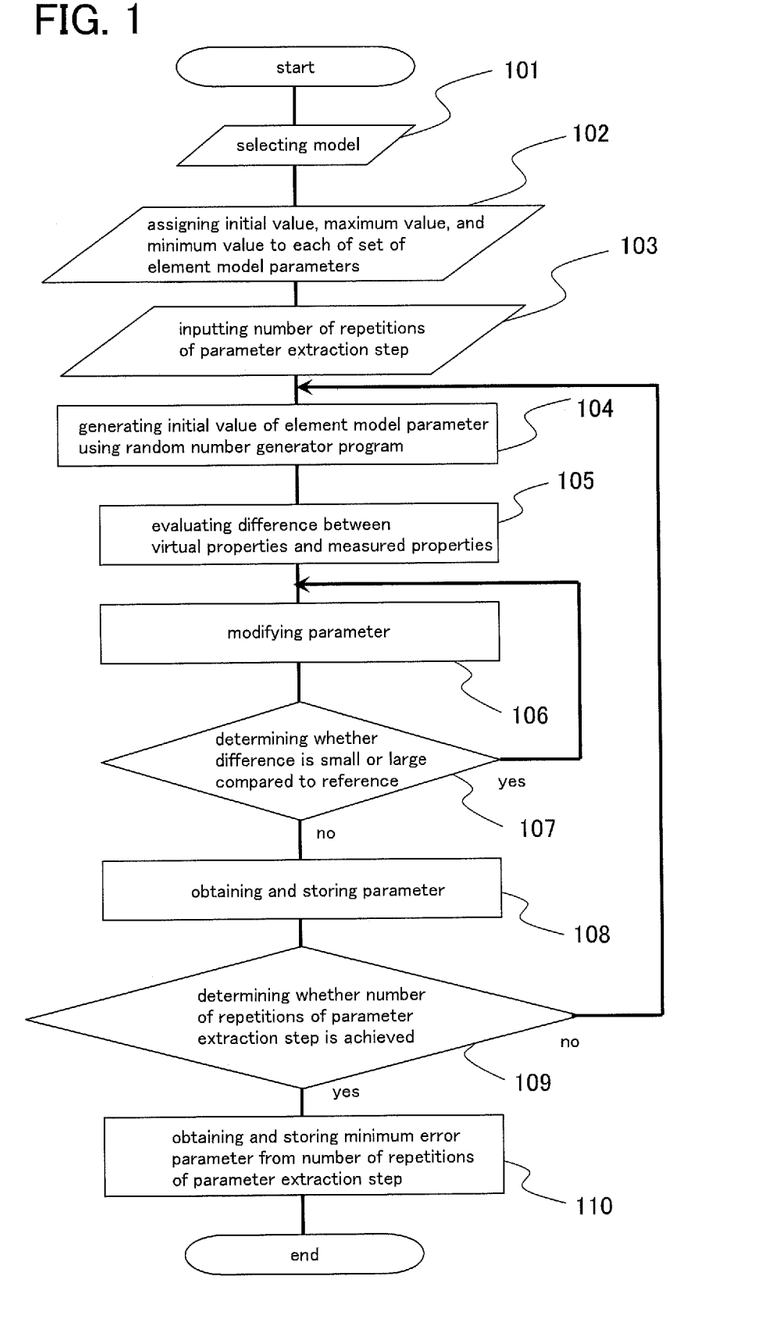
FIG. 1 is a flowchart of Embodiment Mode 1 of the present invention.

FIG. 1 is a flowchart regarding illustrating the parameter extraction method in the present invention. FIG. 1 is a flowchart of automatic parameter extraction in which random numbers are generated by a generator program with uniform probability in a certain range and are used as initial values.

First, a step 101 in FIG. 1 is a step of selecting a model used to describe virtual properties of an element in circuit simulation of SPICE or the like. For example, BSIM3 can be used for a MOSFET and an RPI p-Si model can be used for a TFT, and it is necessary to select a model suitable for characteristics of an element structure.

A model equation may be, for example, a model equation of a BSIM3 model developed in University of California at Berkeley (UCB) in the case of a MOSFET of a semiconductor element for example, or another existing model equation. A model equation is described by an equation using element model parameters, and thus, simulation can be performed using a virtual device having properties approximate to that of a physical device. Note that, for the circuit simulation, SPICE (Simulation Program with Integrated Circuit Emphasis) developed in UCB which is mainly used in a semiconductor field can be used.

Note that a model equation of a semiconductor element may be selected in accordance with the selection of a physical device. For example, a model equation of a MOSFET may be selected from LEVEL1, LEVEL2, LEVEL3, BSIM1, BSIM2, BSIM3, or the like. A model equation of a TFT may be selected from a RPI polysilicon TFT Model, an RPI amorphous TFT Model, or the like. A model equation of a SOI (Silicon on Insulator) may be selected from a UFSOI Model or the like.

Next, a step 102 in FIG. 1 is a step of assigning an initial value, a maximum value, and a minimum value to each of a set of element model parameters for constituting an analytic formula of a model equation selected in the step 101 (hereinafter also referred to simply as parameter set). Regarding the parameter set, there may be cases where standard values are prescribed for each model. The prescribed values may be input or arbitrary values may be input by an operator. A computer is to modify parameters to minimize a difference using as a reference a difference between virtual properties and measured properties at a time when an initial value is assigned to each parameter of a model. If there is no reference, the parameter value which can minimize the difference cannot be searched, so that it is necessary to determine an initial value. Further, in a case where the difference does not have the minimal value with respect to a parameter, for example, a case where a difference does not change even a parameter is changed; the computer continues to search a parameter which makes the difference smaller. Thus, there may be malfunctions in which parameter extraction does not end, information can not be stored in a medium for storing steps of calculations in progress, or the like. Therefore, maximum values and minimum values are required to be set for a parameter set in order to abort an ongoing calculation when a minimal value of the difference is not found.

Note that, an initial value, a maximum value, and a minimum value may be assigned to each parameter of the parameter set. In this case, estimation of the optimum value can be obtained as a more accurate value, which is preferable. Further, a structure in which an initial value, a maximum value, and a minimum value may be assigned to only some selected parameters of the parameter set may be used. In this case, calculation time spent for estimation of the optimum value can be reduced, which is preferable.

Next, a step 103 in FIG. 1 is a step of inputting the number of repetitions of the steps from a step of assigning initial values to the parameter set to the end of parameter extraction. Normally, parameter extraction ends after the steps of from assigning the initial values to obtaining the minimal value of the difference between the virtual properties and the measured properties. In the present invention, a series of steps of randomly assigning initial values to a parameter set to find a combination of the parameter set which can minimize the difference between virtual properties and measured properties through the plurality of parameter extraction operations; thus, possibility of appropriate parameter extraction is improved rapidly. Possibility of appropriate parameter extraction is increased as the number of repetitions is increased; however, the number of repetitions is determined in view of the number of parameters to be extracted, calculation time, or the like.

Next, a step 104 in FIG. 1 is a step of generating an initial value of an element model parameter using a random number generator program, in which all the element model parameters may be determined randomly, or a part of them may be selected and determined randomly.

Next, a step 105 in FIG. 1 is a step of evaluating the difference between virtual properties and measured properties based on the initial values generated in the step 102 or initial values set in the step 104, and the difference is used as a reference for searching a parameter which can reduce the difference.

Next, a step 106 in FIG. 1 is a step of modifying a parameter, in which the parameter is slightly increased or decreased from the initial value. The increase amount or the reduction amount are not limited in particular, and they are adjusted in accordance with the computing speed. Further, when a parameter is modified, the difference between the virtual properties and the measured properties is recomputed.

Next, in FIG. 1, in response to the modification of the parameter and the evaluation of the difference between the virtual properties and the measured properties in step 106, a step 107 is a step of determining whether the difference is small or large compared to the reference. When the difference found in the step 106 is smaller than the reference, the difference found in the step 106 is specified as a new reference and the process returns to the step 106.

When the difference found in the step 106 in FIG. 1 is larger than the reference, the parameter set deriving the difference of the reference is obtained in a step 108, and the parameter set deriving the difference of the reference is stored.

Steps from the step 104 to the step 108 in FIG. 1 are repeated by the number of times inputted in the step 103 in a step 109, a parameter set which can derive the minimum error in the trial repetitions in a step 110 are obtained, and the parameter set which can derive the minimum error in the trial repetitions is stored.

Note that, with respect to each parameter of a model equation which is extracted, after functional design or specifications description of a semiconductor integrated circuit is carried out using a hardware description language (HDL), a net list is generated to define the connections between cells stored in a cell library to realize functions described by the HDL (hereinafter referred to as logic synthesis).

In logic synthesis, circuit simulation can be performed by electing and connecting cells so that timing data and logic data of each cell stored in the cell library are mainly referred to realize desired functions and delay time calculated from the timing data satisfies a predetermined requirement.

Further, when the number of calculations set is large, the calculation time is long accordingly; however, calculation time can be reduced by executing large amount of calculation at a time using a computer capable of parallel computing by a plurality of CPUs (CPU: Central Processing Unit), so called a supercomputer, which is preferable.

Note that there is no problem even when each calculation is executed separately; therefore, results are ultimately compared after finishing all calculation, and a parameter which is the minimum difference between the calculated value and the measured value may be stored.

In this embodiment mode, the random number generator program generates uniform random numbers as the random numbers. Here, advantages of using uniform random numbers as random numbers used as the initial value will be described with reference to FIG. 5. The maximum value and the minimum value shown in FIG. 5 are the maximum value and the minimum value set in the step shown in FIG. 1, and the random number generator program generates initial values which are uniformly possible in a region between the maximum value and the minimum value.

Note that, in this specification, "uniform random numbers" means random numbers of which all the real numbers appear with the same probability in a section between a maximum value and a minimum value.

Figure 5:
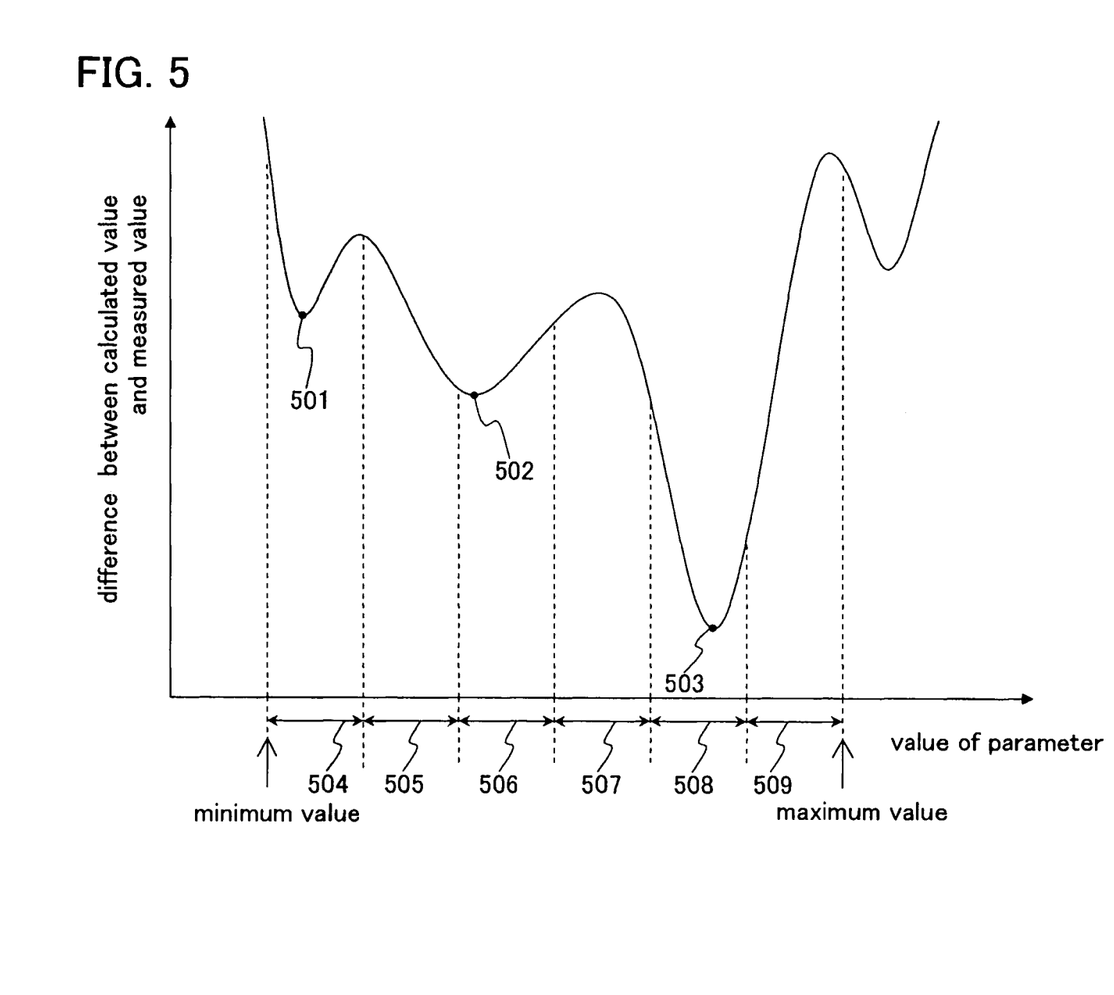
FIG. 5 is a diagram illustrating a parameter extraction method of the present invention.

FIG. 5 shows parameters evenly divided into 6 in a range between the maximum value and the minimum value, and the parameters are assigned initial values 504 to 509. When uniform random numbers are used as initial values, the probabilities in which the initial values are input into the initial value 504, the initial value 505, the initial value 506, the initial value 507, the initial value 508, and the initial value 509 are equal. The relation between a difference and a parameter changes intricately due to influences of element model parameters other than parameters on the horizontal axis; therefore, the difference shall have three extrema of a solution 501, a solution 502, and a solution 503 provided that parameters other than the parameters plotted on the horizontal axis are fixed.

For example, when an initial value is generated in a region shown as the initial value 504, the computer can find the solution 501 using a program searching minimal value of the difference. Alternatively, when an initial value is generated in a region of the initial value 505 or the initial value 506, the solution 502 can be obtained. Thus, uniform random numbers have an advantage in efficiently finding an optimum parameter in a wide region.

After the solution 501, the solution 502, and the solution 503 are found in this manner, a parameter assigning the best parameter, that is, the solution which derives the minimum error can be obtained and stored in the step 10 in FIG. 1 to perform parameter extraction.

With the structure of the present invention as above, the present invention makes it unnecessary for an operator to set initial values by randomly generating initial values of parameters using a random number generator program and performing parameter extraction using the initial values as starting points.

Further, in order to set initial values appropriately, skills are required such as understanding of a model equation having a physical meaning and good understanding of processes and properties of an object physical device of which parameters is to be extracted. In accordance with the present invention, even novices can easily extract parameters of a model equation having a physical meaning. Thus, significant model modification, designing of a physical device, or change in a manufacturing process can be dealt flexibly.

Still further, in the case where parameter extraction of parameters of a model equation having a physical meaning is executed from an input-output responses (also referred to as an output value in accordance with an input value) of a plurality of physical devices having the same sizes which are manufactured through the same processes for the purpose of statistical analysis or the like, when there are significant variations between the input-output responses of the physical devices, there may be cases where optimal solutions of each device can not be obtained unless a plurality of initial values are prepared. The present invention particularly makes it possible in the case described above for even novices to find optimal solutions of parameters without inputting a plurality of initial values.

Note that this embodiment mode can be implemented in combination with description of the other embodiment mode in this specification.

Embodiment Mode 2

This embodiment mode will describe a different structure then that described in Embodiment Mode 1. A parameter extraction method in Embodiment Mode 2 is a variation of the element model parameter extraction method according to Embodiment Mode 1, and provides an accurate parameter extraction method for a plurality of elements formed through the same processes which have variations in measured properties.

In Embodiment Mode 1, uniform random numbers are generated as initial values of element model parameters; however, in this embodiment mode, normal random numbers are used as random numbers. A parameter extraction method will be described below in which calculation can be performed with a reduced computing time by using normal random numbers as random numbers.

Note that the normal random numbers may be generated by using Box-Muller method in which uniform random numbers are converted into normal numbers.

Even though different parameters are extracted, each parameter of a plurality of elements of the same kind is considered to be distributed around certain averages. Therefore, the uniform random numbers generated as random numbers using the random number generator program in Embodiment Mode 1 are replaced with normal random numbers here.

If one element is selected from the plurality of elements of the same kind and their properties are measured, and parameter extraction is performed with high accuracy; parameters of the other elements are likely around the extracted parameters as well. In that case, optimal solutions of the other elements for minimizing the difference are more likely found by selecting initial values form normal random numbers generated around the extracted parameters than by implementing Embodiment Mode 1. On the other hand, when normal random numbers are widely distributed, the initial values can have flexibility in a measure.

This embodiment mode will be described with reference to the flowchart in FIG. 3.

Figure 3:
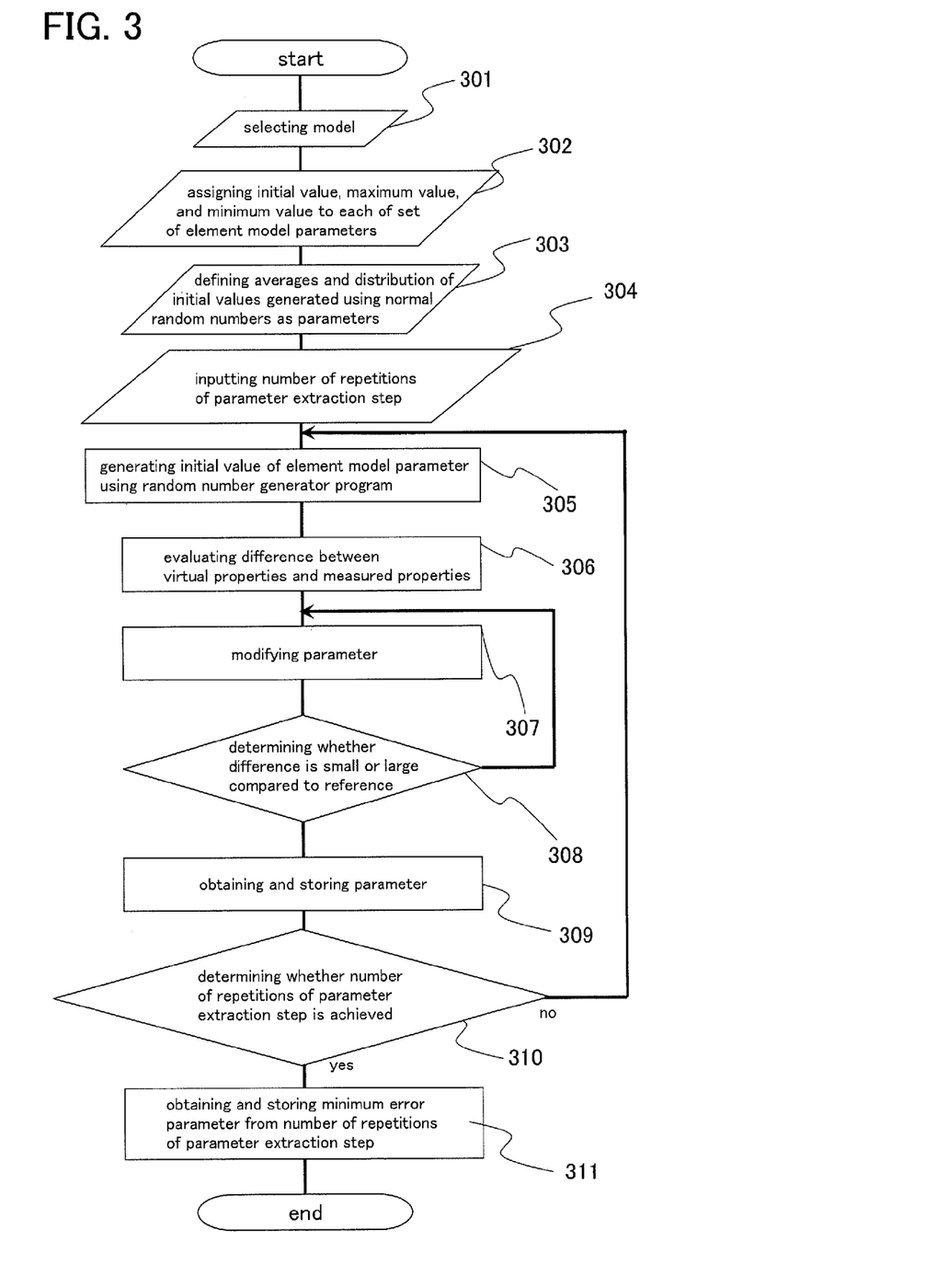
FIG. 3 is a flowchart of Embodiment Mode 2 of the present invention.

In FIG. 3, a step 301 is a step of selecting a model used to describe virtual properties of an element in circuit simulation of SPICE or the like. For example, BSIM3 can be used for a MOSFET and an RPI p-Si model can be used for a TFT, and it is necessary to select a model suitable for characteristics of an element structure.

In FIG. 3, a step 302 is a step of assigning an initial value, a maximum value, and a minimum value to each of a set of parameters for constituting an analytic formula of a model equation selected in the step 301. Regarding the parameter set, there may be cases where standard values are prescribed for each model equation. The prescribed values may be input or arbitrary values may be input by an operator. A computer is to modify parameters to minimize a difference using as a reference a difference between virtual properties and measured properties at a time when an initial value is assigned to each parameter of a model equation. If there is no reference, the parameter value which can minimize the difference cannot be searched, so that it is necessary to determine an initial value. Further, there are cases where the difference does not have the minimal value with respect to a parameter, for example, a case where a difference does not change even a parameter is changed, or the like. In a case where the difference does not have the minimal value, the computer continues to search a parameter which makes the difference smaller. Thus, there may be malfunctions in which parameter extraction does not end, information can not be stored in a medium for storing steps of calculations in progress, or the like. Therefore, maximum values and minimum values are required to be set for each parameter of the parameter set of the model equation in order to abort an ongoing calculation when a minimal value of the difference is not found.

In FIG. 3, a step 303 is a step of defining averages and distribution of initial values generated using normal random numbers as parameters. In the case of extracting parameters of a plurality of elements, typical parameter values are used as average values, distribution is made larger when elements vary widely, and the distribution is made smaller when the elements have small variation; thus, the way of generating the initial values may be more flexible. Thus, the initial values are focused in a measure to achieve efficient parameter extraction and flexibility of distribution; thus, such a case where the difference cannot be minimized unless the initial values are set apart from the average values because of wide variation of the elements.

In FIG. 3, a step 304 is a step of inputting the number of repetitions of the steps from a step of assigning initial values to an element model parameter set to the end of parameter extraction. Normally, parameter extraction ends after the steps of from assigning the initial values to obtaining the minimal value of the difference between the virtual properties and the measured properties. However, in the present invention, a series of steps of randomly assigning initial values to a parameter set to find a combination of the parameter set which can minimize the difference between virtual properties and measured properties through the plurality of parameter extraction operations; thus, possibility of appropriate parameter extraction is improved rapidly. Possibility of appropriate parameter extraction is increased as the number of repetitions is increased; however, the number of repetitions is determined in view of the number of parameters to be extracted, calculation time, or the like.

In FIG. 3, a step 305 is a step of generating an initial value of an element model parameter using a random number generator program, in which all the element model parameters may be determined randomly, or a part of them may be selected and determined randomly.

In FIG. 3, a step 306 is a step of evaluating the difference between virtual properties and measured properties based on the initial values generated in the step 302 or initial values set in the step 305, and the difference is used as a reference for searching a parameter which can reduce the difference.

In FIG. 3, a step 307 is a step modifying a parameter, in which the parameter is slightly increased or decreased from the initial value. The increase amount or the reduction amount are not limited in particular, and they are adjusted in accordance with the computing speed. Further, when a parameter is modified, the difference between the virtual properties and the measured properties is recomputed.

In FIG. 3, in response to the modification of the parameter and the evaluation of the difference between the virtual properties and the measured properties in step 307, a step 308 is a step of determining whether the difference is small or large compared to the reference. When the difference found in the step 307 is smaller than the reference, the difference found in the step 306 is specified as a new reference and the process returns to the step 307.

In FIG. 3, when the difference found in the step 307 is larger than the reference, the parameter set deriving the difference of the reference is obtained and stored in a step 108.

In FIG. 3, steps from the step 305 to the step 309 are repeated by the number of times inputted in the step 304 in a step 310, a parameter set which can derive the minimum error in the trial repetitions in a step 311 are obtained, and the parameter set which can derive the minimum error in the trial repetitions is stored.

With the structure of the present invention as above, the present invention makes it unnecessary for an operator to set initial values by randomly generating initial values of parameters using a random number generator program and performing parameter extraction using the initial values as starting points. Moreover, when normal random numbers are generated as random numbers generated using a random number generator program, the parameters can be obtained with reduced calculation time, which is preferable.

Further, in order to set initial values appropriately, skills are required such as understanding of a model equation having a physical meaning and good understanding of processes and properties of an object physical device of which parameters is to be extracted. In accordance with the present invention, even novices can easily extract parameters of a model equation having a physical meaning. Thus, significant model modification, designing of a physical device, or change in a manufacturing process can be dealt flexibly.

Still further, in the case where parameter extraction of parameters of a model equation having a physical meaning is executed from an input-output responses of a plurality of physical devices having the same sizes which are manufactured through the same processes for the purpose of statistical analysis or the like, when there are significant variations between the input-output responses of the physical devices, there may be cases where optimal solutions of each device can not be obtained unless a plurality of initial values are prepared. The present invention particularly makes it possible in the case described above for even novices to find optimal solutions of parameters without inputting a plurality of initial values.

Note that this embodiment mode can be implemented in combination with description of the other embodiment mode in this specification.

Embodiment 1

This embodiment will describe a storage medium storing a parameter extraction method of the present invention as a program which can be executed with a computer.

A storage medium of the invention can store parameter extraction methods described in the above embodiment modes as a computer readable program to be executed using a computer. For example, the parameter extraction methods can be stored in a storage medium such as a magnetic disk, a hard disk, a CD ROM, a memory card, or a magneto-optical disk and can be used when read with a computer. The storage medium of the invention contains a program for executing a parameter extraction method. Thus, a program stored in a computer can be read.

Note that this embodiment can be freely combined with the above-described embodiment modes. Therefore, it is not necessary for an operator to set initial values by randomly generating initial values of parameters using a random number generator program and performing parameter extraction using the initial values as starting points.

Further, in order to set initial values appropriately, skills are required such as understanding of a model equation having a physical meaning and good understanding of processes and properties of an object physical device of which parameters is to be extracted. In accordance with the present invention, even novices can easily extract parameters of a model equation having a physical meaning. Thus, significant model modification, designing of a physical device, or change in a manufacturing process can be dealt flexibly.

Still further, in the case where parameter extraction of parameters of a model equation having a physical meaning is executed from an input-output responses of a plurality of physical devices having the same sizes which are manufactured through the same processes for the purpose of statistical analysis or the like, when there are significant variations between the input-output responses of the physical devices, there may be cases where optimal solutions of each device can not be obtained unless a plurality of initial values are prepared. The present invention particularly makes it possible in the case described above for even novices to find optimal solutions of parameters without inputting a plurality of initial values.

This application is based on Japanese Patent Application serial No. 2006-114945 filed in Japan Patent Office on Apr. 18, 2006, the entire contents of which are hereby incorporated by reference.

What is claimed is:

1. A non-transitory computer readable storage medium storing a program extracting a parameter for each of a plurality of elements of a model equation,
wherein when the program is executed by a computer:
the computer obtains an input-output response of a physical device,
the computer sets an initial value of the parameter for each of a plurality of elements of the model equation,
the computer modifies the initial value of the parameter for each of the plurality of elements of the model equation, the computer evaluates a difference between the input-output response of the physical device and an output result of the model equation to which the parameter is inputted, the computer determines whether the difference is smaller than a reference difference value, the computer resets an initial value of the parameter for each of the plurality of elements of the model equation N times, and the computer extracts the parameter which corresponds to a minimum difference between the input-output response of the physical device and the output result of the model equation to which the parameter is inputted after resetting the initial value of the parameter N times, wherein the physical device comprises a semiconductor element, wherein the initial value of the parameter for each of the plurality of elements of the model equation is assigned by a random number generator program, and wherein N is a positive integer, N≥1.

2. A non-transitory computer readable storage medium according to claim 1, wherein the program when executed by the computer performs a step of automatically updating an initial value of the parameter for each of the plurality of elements of the model equation based on an algorithm for identifying the parameter which reduces a difference between input-output response of the physical device and an output result of the model equation into which the parameter is inputted, and wherein the step of automatically updating the initial value of the parameter for each of the plurality of elements of the model equation is ended based on reference criteria set with respect to the parameter.

3. A non-transitory computer readable storage medium according to claim 2, wherein the program when executed by the computer performs a step of setting a number of plural repetition of steps from a step of setting the initial value of the parameter for each of the plurality of elements of the model equation to the step of automatically updating the initial value of the parameter for each of the plurality of elements of the model equation, wherein the difference between the input-output response of the physical device and the model equation into which the parameter is inputted in each of the plural repetition of the steps is compared, and wherein the parameter which corresponds to a minimum difference between the input-output response of the physical device and the model equation into which the parameter is inputted is extracted.

4. A non-transitory computer readable storage medium according to claim 1, wherein the semiconductor element is any one of an electric field effect transistor, a thin film transistor, a bipolar transistor, a capacitor element, and a resistance element.

5. A non-transitory computer readable storage medium storing a program extracting a parameter for each of a plurality of elements of a model equation, wherein when the program is executed by a computer:

the computer obtains an input-output response of a physical device in a first step, the computer sets a minimum value and a maximum value of the parameter for each of a plurality of elements of the model equation in a second step, the computer sets a number of repetitions of an extraction of the parameter to N in a third step, the computer sets an initial value of the parameter for each of a plurality of elements of the model equation by a random number generator program with uniform probability from the minimum value to the maximum value in a fourth step, the computer evaluates a difference between the input-output response of the physical device and an output result of the model equation to which the parameter is inputted in a fifth step, the computer modifies the initial value of the parameter for each of the plurality of elements of the model equation in a sixth step, the computer determines whether the difference is smaller than a reference difference value in a seventh step wherein the steps from the sixth step to the seventh step are repeated when the difference is not smaller than the reference difference value, the computer extracts the parameter when the difference is smaller than the reference difference value in an eighth step, the computer determines whether a number of repetitions of the eighth step is N in a ninth step wherein the steps from the fourth step to the ninth step are repeated when the number of repetitions of the eighth step is less than N, and the computer extracts the parameter which corresponds to a minimum difference between the input-output response of the physical device and the output result of the model equation to which the parameter is inputted in a tenth step when the number of repetitions of the eighth step is N, wherein the physical device comprises a semiconductor element, wherein N is a positive integer, N≥1.

6. A non-transitory computer readable storage medium according to claim 5, wherein the semiconductor element is any one of an electric field effect transistor, a thin film transistor, a bipolar transistor, a capacitor element, and a resistance element.

* * * * *